(12) United States Patent
Kim

(10) Patent No.: US 10,310,002 B2
(45) Date of Patent: Jun. 4, 2019

(54) APPARATUS AND METHOD FOR DETECTING LEAKAGE CURRENT OF HIGH-POWER LINE OF INVERTER OF 48V MILD HYBRID SYSTEM

(71) Applicant: Hyundai Mobis Co., Ltd., Seoul (KR)

(72) Inventor: Sang Min Kim, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 7 days.

(21) Appl. No.: 15/638,301

(22) Filed: Jun. 29, 2017

(65) Prior Publication Data

US 2018/0143235 A1    May 24, 2018

(30) Foreign Application Priority Data

Nov. 18, 2016    (KR) .......................... 10-2016-0153967

(51) Int. Cl.

| | |
|---|---|
| *B60W 10/06* | (2006.01) |
| *B60W 10/08* | (2006.01) |
| *B60W 10/26* | (2006.01) |
| *B60W 20/15* | (2016.01) |
| *G01R 31/02* | (2006.01) |
| *G01R 31/30* | (2006.01) |

(Continued)

(52) U.S. Cl.
CPC ........... *G01R 31/025* (2013.01); *B60W 10/06* (2013.01); *B60W 10/08* (2013.01); *B60W 10/26* (2013.01); *B60W 20/15* (2016.01); *G01R 31/3008* (2013.01); *G01R 31/40* (2013.01); *G01R 31/42* (2013.01); *B60W 2710/086* (2013.01)

(58) Field of Classification Search
CPC .......................... G01R 31/025; G01R 31/3008
See application file for complete search history.

(56) References Cited

U.S. PATENT DOCUMENTS

| | | | | |
|---|---|---|---|---|
| 2005/0280422 | A1* | 12/2005 | Kishibata ............. | G01R 31/025 324/522 |
| 2011/0043303 | A1* | 2/2011 | Herron ................. | H05K 1/0233 333/181 |

(Continued)

*Primary Examiner* — Noam Reisner
(74) *Attorney, Agent, or Firm* — H.C. Park & Associates, PLC

(57) ABSTRACT

Provided are an apparatus and method for detecting a leakage current of a high-power line of an inverter of a 48V mild hybrid system. The apparatus includes a starter generator manufactured as a synchronous motor, in which a conventional field winding is wound around a rotor, and configured to generate starting torque and generating torque for an engine, a 48V battery configured to supply a 48V direct current (DC) power and be charged by the starter generator, a 12V battery configured to supply power to internal electrical components of a vehicle, an integrated starter generator (ISG) control inverter provided between the starter generator and the 48V battery and provided as a power semiconductor switch which controls a stator and the rotor of the starter generator, wherein a winding output from the inverter is connected to the rotor through a brush and a slip ring, a DC-DC converter configured to convert the power of the 48V battery into 12V battery power and supply the 12V power, a common mode (CM) choke provided between the ISG control inverter and the 48V battery, and a leakage current detector connected to the CM choke and configured to detect a leakage current.

6 Claims, 8 Drawing Sheets

(51) Int. Cl.
  *G01R 31/40* (2014.01)
  *G01R 31/42* (2006.01)

(56) References Cited

U.S. PATENT DOCUMENTS

| | | | |
|---|---|---|---|
| 2015/0009725 A1* | 1/2015 | Taguchi | H02M 7/48 363/35 |
| 2016/0059712 A1* | 3/2016 | Jang | B60L 11/18 307/10.1 |
| 2016/0137078 A1* | 5/2016 | Yun | B60L 11/1812 307/10.1 |

* cited by examiner

APPARATUS AND METHOD FOR DETECTING LEAKAGE CURRENT OF HIGH-POWER LINE OF INVERTER OF 48V MILD HYBRID SYSTEM

CROSS-REFERENCE TO RELATED APPLICATION

This application claims priority from and the benefit of Korean Patent Application No. 10-2016-0153967, filed on Nov. 18, 2016, which is hereby incorporated by reference for all purposes as if set forth herein.

BACKGROUND

1. Field of the Invention

The present invention relates to an apparatus and method for detecting a leakage current of a high-power line of an inverter of a 48V mild hybrid system, and more particularly, to an apparatus and method for detecting a leakage current by providing a common mode (CM) choke and an additional winding between an inverter and a 48V battery.

2. Discussion of Related Art

A starter generator (an integrated starter generator (ISG)) applied to a 48V mild hybrid system provides starting torque and generating torque for an engine and is usually manufactured as a synchronous motor in which a field winding is wound around a rotor.

A starter generator control inverter is provided as a power semiconductor switch for controlling a stator and rotor of the starter generator, and a winding which is output from the inverter is connected to the rotor through a brush and a slip ring.

In a 48V mild hybrid system, in order to reduce sizes and costs of an inverter and a converter which are used under a condition of a low-voltage direct current (DC) of 60V or less and constitute a 48V system, which are classified as low-voltage, a power converter is manufactured with power circuits of a normal non-isolated topology. Due to a property of the non-isolated power converter, a ground of a 12V battery power and a ground of a 48V system, which are used in an existing vehicle, have the same potential. Conventionally, in a general vehicle, a ground of a 12V battery power is grounded to a vehicle chassis.

In a non-isolated system in which a 48V ground and a 12V ground have the same potential, when a negative (−) line (or a ground line) of a 48V power line connected to a non-isolated inverter has a large resistance or is disconnected due to a contact failure, a 48V load current supplied from a battery to the inverter may flow to a ground line of a 12V battery through a 12V ground line (or a vehicle chassis), thereby causing an electrical safety problem. In addition, there is a problem in that other electrical components may malfunction due to noise caused by a leakage current.

In order to detect a cable contact failure of a conventional high-power line, an existing power converter, such as a high-voltage inverter and a converter, uses a connector which is provides an interlock function to detect a contact failure or non-insertion of the connector. However, there is a problem in that costs of parts are increased due to the cost of developing a dedicated connector, and there is a problem in that a leakage current generated in a high-voltage DC line may not be detected despite the interlock function.

SUMMARY OF THE INVENTION

The present invention is directed to a method and system for detecting a leakage current using a common mode (CM) choke, which is a conventionally used power part.

Further, the present invention is directed to a method of detecting a leakage current using a 48V mild hybrid starter generator (MHSG) control inverter.

The scope of the present invention is not limited to the above-described objects, and other unmentioned objects may be clearly understood by those skilled in the art from the following descriptions.

According to an aspect of the present invention, there is provided an apparatus for detecting a leakage current of a high-power line of an inverter of a 48V mild hybrid system, the apparatus including a starter generator manufactured as a synchronous motor in which a conventional field winding is wound around a rotor and configured to generate starting torque and generating torque for an engine, a 48V battery configured to supply 48V direct current (DC) power and be charged by the starter generator, a 12V battery configured to supply power to internal electrical components of a vehicle, an integrated starter generator (ISG) control inverter provided between the starter generator and the 48V battery and provided as a power semiconductor switch which controls a stator and the rotor of the starter generator, wherein a winding output from the inverter is connected to the rotor through a brush and a slip ring, a DC-DC converter configured to convert the power of the 48 v battery into 12V battery power and supply the 12V power, a CM choke provided between the ISG control inverter and the 48V battery, and a leakage current detector connected to the CM choke and configured to detect a leakage current.

According to another aspect of the present invention, there is provided a method of detecting a leakage current of a high-power line of an inverter of a 48V mild hybrid system, the method including generating, by a starter generator, starting torque and generating torque for an engine, supplying, by an ISG controller inverter, 48V DC power from the generated generating torque to a 48V battery, supplying, by a DC-DC converter, the 48V DC power to a 12V battery, allowing a wire of the inverter to be disconnected and a leakage voltage to be generated in a CM choke due to an induced electromotive force, measuring the leakage voltage, and detecting a leakage current from the leakage voltage.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Advantages and features of the present invention and methods of achieving the same should be clearly understood with reference to the accompanying drawings and the following detailed embodiments. However, the present invention is not limited to embodiments to be disclosed below and may be implemented in various different forms. The embodiments are provided in order to fully explain the present invention and fully explain the scope of the present invention for those skilled in the art. The scope of the present invention is defined by the appended claims. Meanwhile, the terms used herein are provided only to describe embodiments of the present invention and not for purposes of limitation. Unless the context clearly indicates otherwise, the singular forms include the plural forms. It should be understood that the terms "comprise" and/or "comprising," when used herein, specify some stated components, steps, operations, and/or elements, but do not preclude the presence or addition of one or more other components, steps, operations, and/or elements.

Hereinafter, exemplary embodiments of the present invention will be described in detail with reference to the accompanying drawings.

Figure 1:
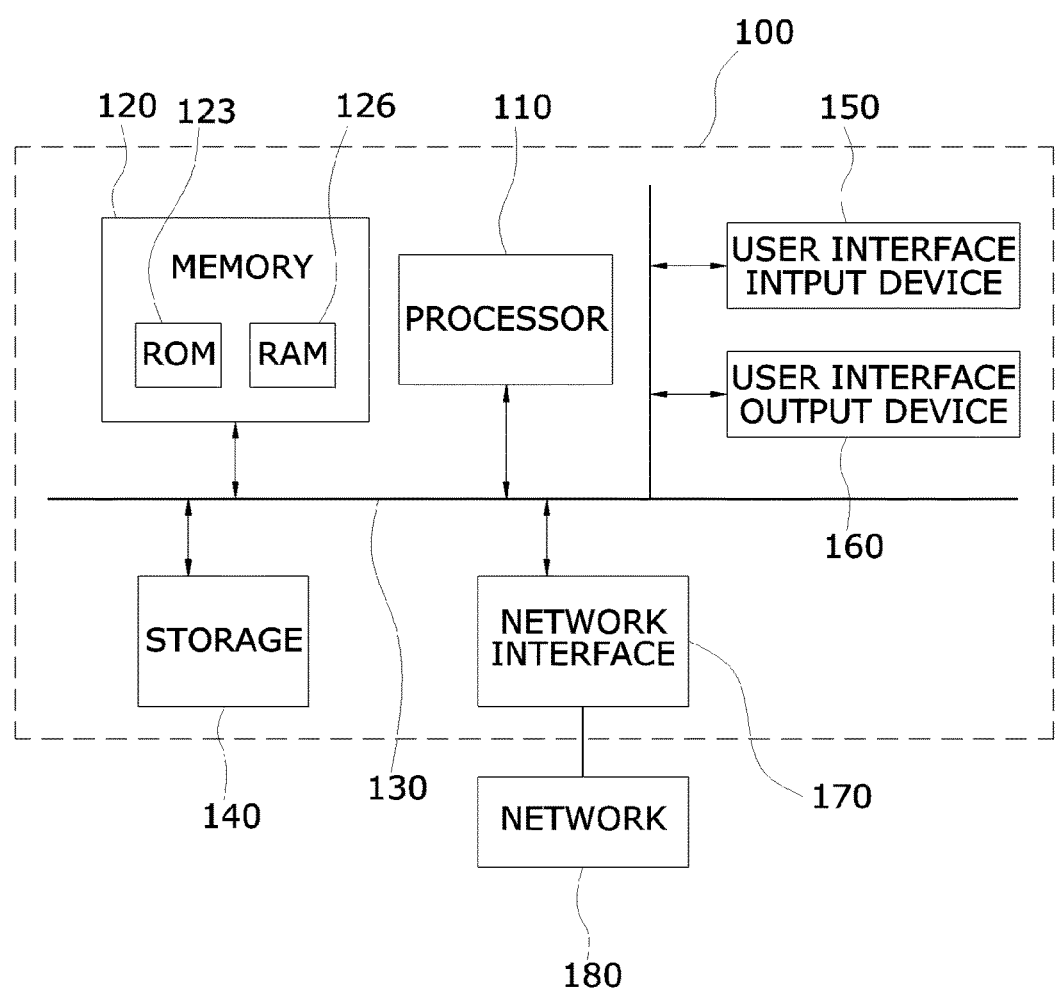
FIG. 1 is a diagram for describing an example of a configuration of a computer system implementing a method of detecting a leakage current of a high-power line of an inverter of a 48V mild hybrid system according to an embodiment of the present invention.

FIG. 1 is a diagram for describing an example of a configuration of a computer system implementing a method of detecting a leakage current of a high-power line of an inverter of a 48V mild hybrid system according to an embodiment of the present invention.

Meanwhile, the method of detecting a leakage current of a high-power line of an inverter of a 48V mild hybrid system according to the embodiment of the present invention may be implemented in a computer system or recorded in a recording medium. As illustrated in FIG. 1, a computer system may include at least one processor 110, a memory 120, a user input device 150, a data communication bus 130, a user output device 160, and a storage 140. The above-described components perform data communication with each other through the data communication bus 130.

The computer system may further include a network interface 170 connected to a network 180. The processor 110 may be a central processing unit (CPU) or may be a semiconductor device which processes instructions stored in the memory 120 and/or the storage 140.

The memory 120 and the storage 140 may include various types of volatile or non-volatile storing media. For example, the memory 120 may include a read-only memory (ROM) 123 and a random access memory (RAM) 126.

Therefore, the method of detecting a leakage current of a high-power line of an inverter of a 48V mild hybrid system according to an embodiment of the present invention may be implemented in a computer-executable manner. When the method of detecting a leakage current of a high-power line of an inverter of a 48V mild hybrid system according to an embodiment of the present invention is performed in a computer system, computer-readable instructions may perform the detecting method according to the embodiment of the present invention.

Meanwhile, the above-described method of detecting a leakage current of a high-power line of an inverter of a 48V mild hybrid system according to the present invention may be implemented as computer-readable codes in a computer-readable recording medium. The computer-readable recording medium includes all types of recording media which stores data that may be decoded by a computer system. For example, the computer-readable recording medium may include a ROM, a RAM, a magnetic tape, a magnetic disk, a flash memory, an optical data storage, and the like. Also, codes which are distributed to computer systems connected via a computer network and which may be read in a distributed manner may be stored and executed in the computer-readable recording medium.

Figure 2:
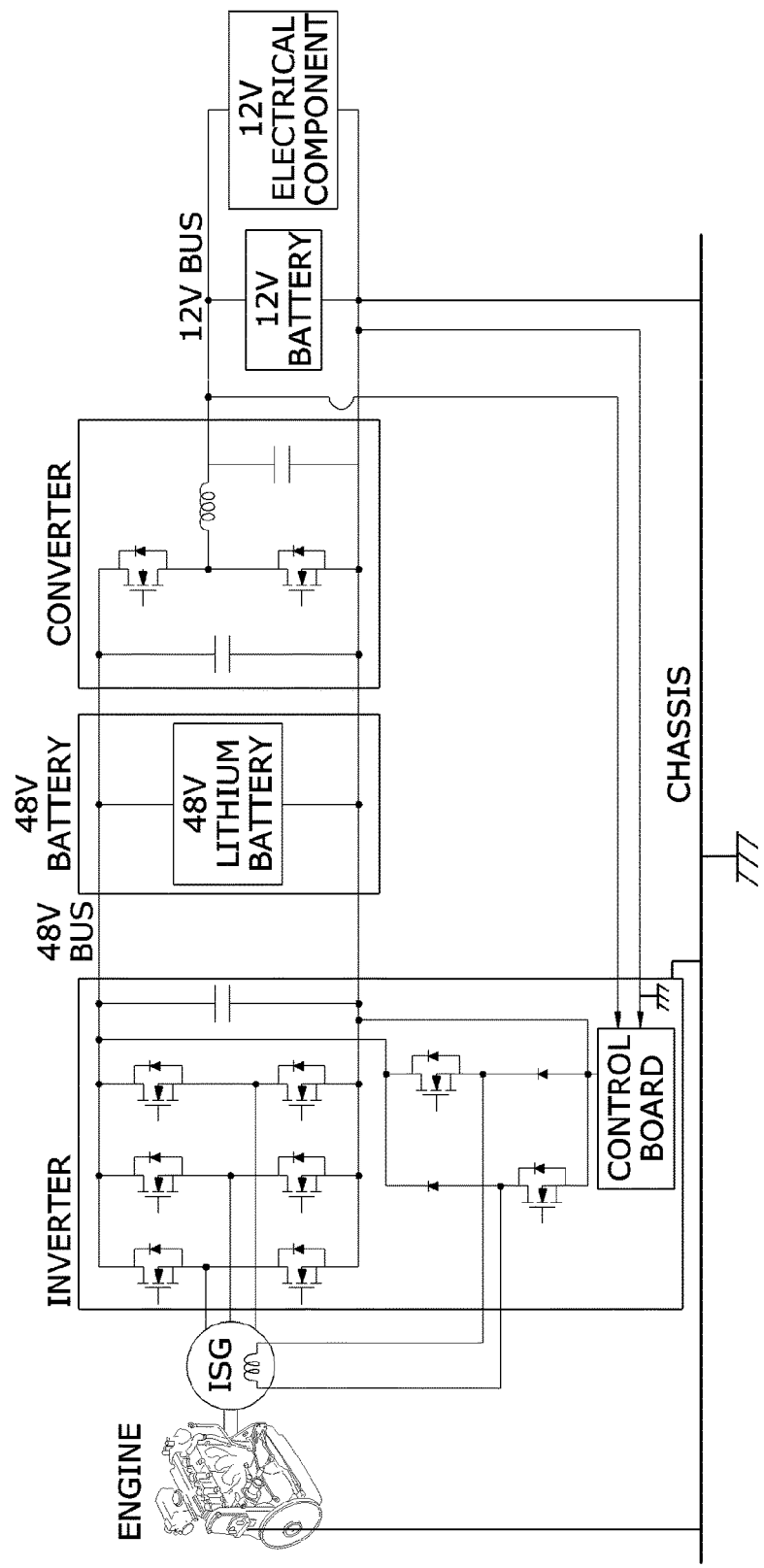
FIG. 2 is a diagram illustrating a basic configuration of a 48V mild hybrid system.

FIG. 2 is a diagram illustrating a basic configuration of a 48V mild hybrid system.

A hybrid car refers to a car that is made to use two or more drivelines. Conventionally, a hybrid car is made by adding an electric motor to a conventional engine using petroleum. Hybrid cars are divided into full hybrid systems, mild hybrid systems, and plug-in hybrid systems. The mild hybrid systems are based on engine power and motors thereof only assist, unlike the full hybrid systems. That is, the mild hybrid systems may not be driven only by the motors. However, the mild hybrid systems have an advantage in that fuel efficiency ratio thereof is high in comparison to a production cost thereof. As environmental problems of diesel cars have recently become an issue, major automobile companies around the world, such as Volkswagen, Audi, Hyundai Mobis which is an applicant of the present invention, and the like, have become interested in a 48V mild hybrid system and are spurring the development thereof.

The 48V mild hybrid system includes an engine, a starter generator, an integrated starter generator (ISG) control inverter, a 48V battery, a converter, a 12V battery, and a 12V electrical component as basic components thereof.

In the 48V mild hybrid system, the starter generator is often called an ISG, and the starter generator applied to the 48V mild hybrid system is usually manufactured as a synchronous motor in which a field winding is wound around a rotor to provide starting torque and generating torque for an engine. In other words, conventionally, the starter generator is used when starting the engine and assists an electric motor during driving or operates as a generator when a battery is discharged.

The ISG control inverter is provided between the starter generator and the 48V battery. The ISG control inverter is provided as a power semiconductor switch which controls a stator and the rotor of the starter generator, and a winding which is output from the inverter is connected to the rotor through a brush and a slip ring. In the 48V mild hybrid system, the converter provided between the 48V battery and the 12V battery is a direct current (DC)-DC converter which converts a 48V voltage into a 12V voltage.

In the 48V mild hybrid system, in order to reduce sizes and costs of an inverter and a converter which are used under a condition of a low-voltage DC of 60V or less and constitute a 48V system, a power converter is manufactured with a power circuit of a normal non-isolated topology. Due to a property of the non-isolated power converter, a ground of a 12V battery power and a ground of the 48V system, which are used in an existing vehicle, have the same potential. Conventionally, in a general vehicle, a ground of a 12V battery power is grounded to a vehicle chassis.

In the non-isolated system in which a 48V ground and a 12V ground have the same potential, when a negative (−) line (or a ground line) of a 48V power line connected to the non-isolated inverter has a large resistance or is disconnected due to a contact failure, a 48V load current supplied from a battery to the inverter may flow to a ground line of a 12V battery through a 12V ground line (or a vehicle chassis), thereby causing an electrical safety problem. In addition, there is a problem in that other electrical components may malfunction due to noise caused by a leakage current.

In order to detect a cable contact failure of a conventional high-power line, an existing power converter, such as a high-voltage inverter and a converter, uses a connector which provides an interlock function to detect a contact failure or non-insertion of the connector. However, in this case, there is a disadvantage in that development of a dedicated connector is required and the dedicated connector is implemented at a high price. Also, there is a problem in that a leakage current generated in a high-voltage DC line may not be detected despite the interlock function.

In the present invention, a method and apparatus for detecting a leakage current by utilizing conventionally used power parts are disclosed. In an embodiment, a method of detecting a leakage current of a 48V mild hybrid starter generator (MHSG) control inverter is disclosed.

Figure 3:
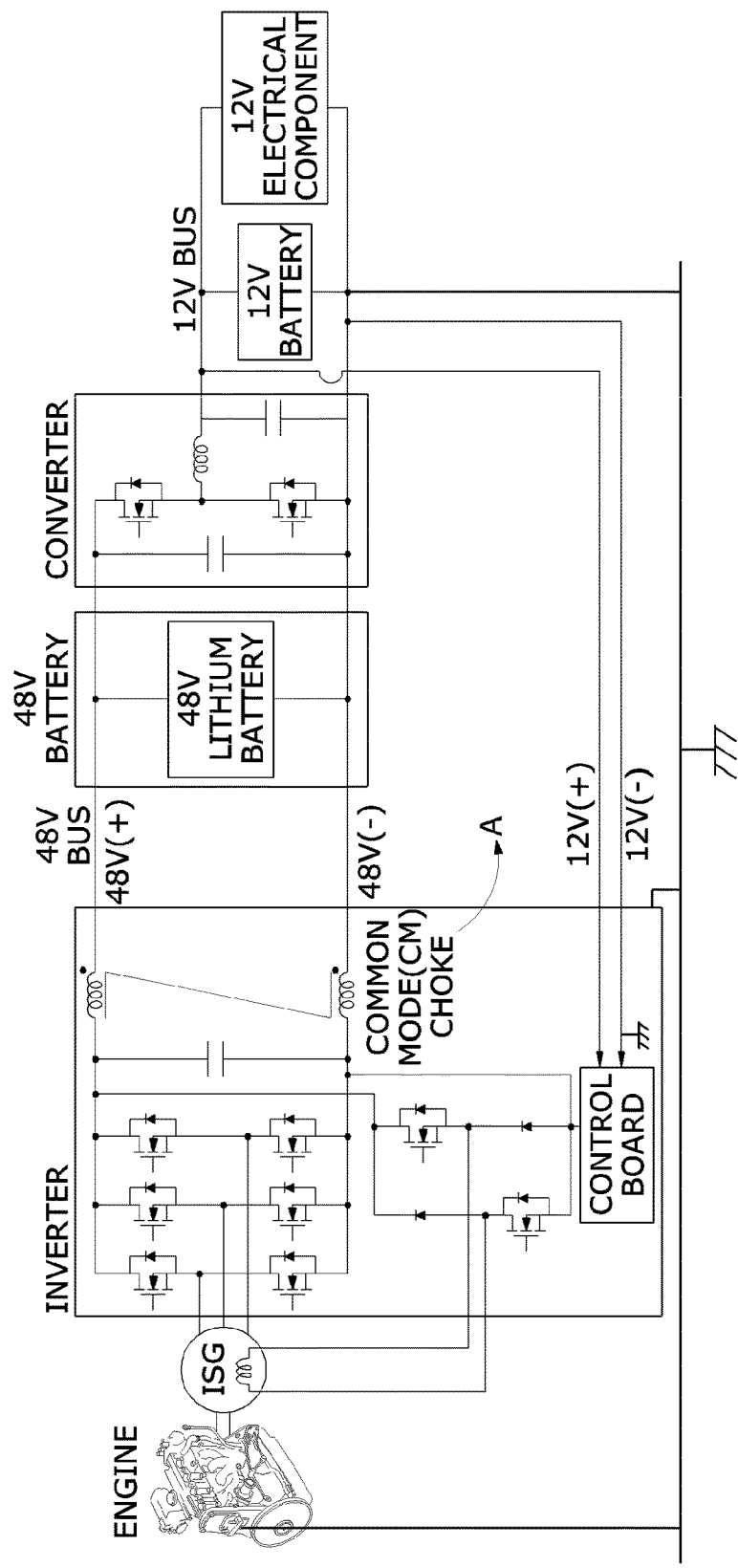
FIG. 3 is a diagram illustrating a configuration of an apparatus for detecting a leakage current of a high-power line of an inverter of a 48V mild hybrid system according to an embodiment of the present invention.

FIG. 3 is a diagram illustrating a configuration of an apparatus for detecting a leakage current of a high-power line of an inverter of a 48V mild hybrid system according to an embodiment of the present invention.

In the apparatus for detecting a leakage current of a high-power line of an inverter of a 48V mild hybrid system according to the embodiment of the present invention, an inverter integrated starter generator (IISG) usually includes an input filter for EMC-compliant design. A CM choke is used to reduce CM noise in the input filter.

The CM choke is a power part (an inductor) used to reduce a CM noise current. However, a difference between currents which flow in two lines through an additional winding as well as positive (+) and negative (−) lines, which are wound around a conventional ferrite core, that is, a leakage current, may be detected. As an embodiment in which the CM choke is mounted on the inverter, in addition to wound 48V positive (+) and negative (−) lines of the CM choke of FIG. 4, one or more additional windings such as "B" may be provided.

Figure 4:
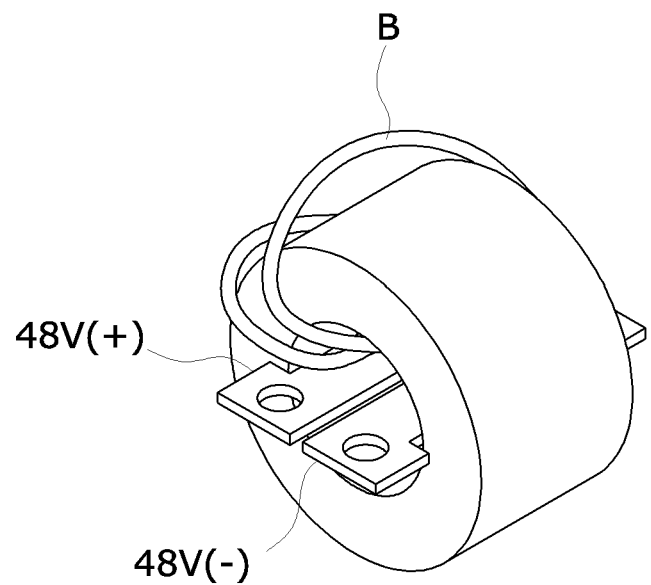
FIG. 4 is a perspective view illustrating a common mode (CM) choke for an inverter which is used in an apparatus for detecting a leakage current of a high-power line of an inverter of a 48V mild hybrid system according to an embodiment of the present invention.

FIG. 4 is a perspective view illustrating a CM choke for an inverter which is used in an apparatus for detecting a leakage current of a high-power line of an inverter of a 48V mild hybrid system according to an embodiment of the present invention.

Figure 5:
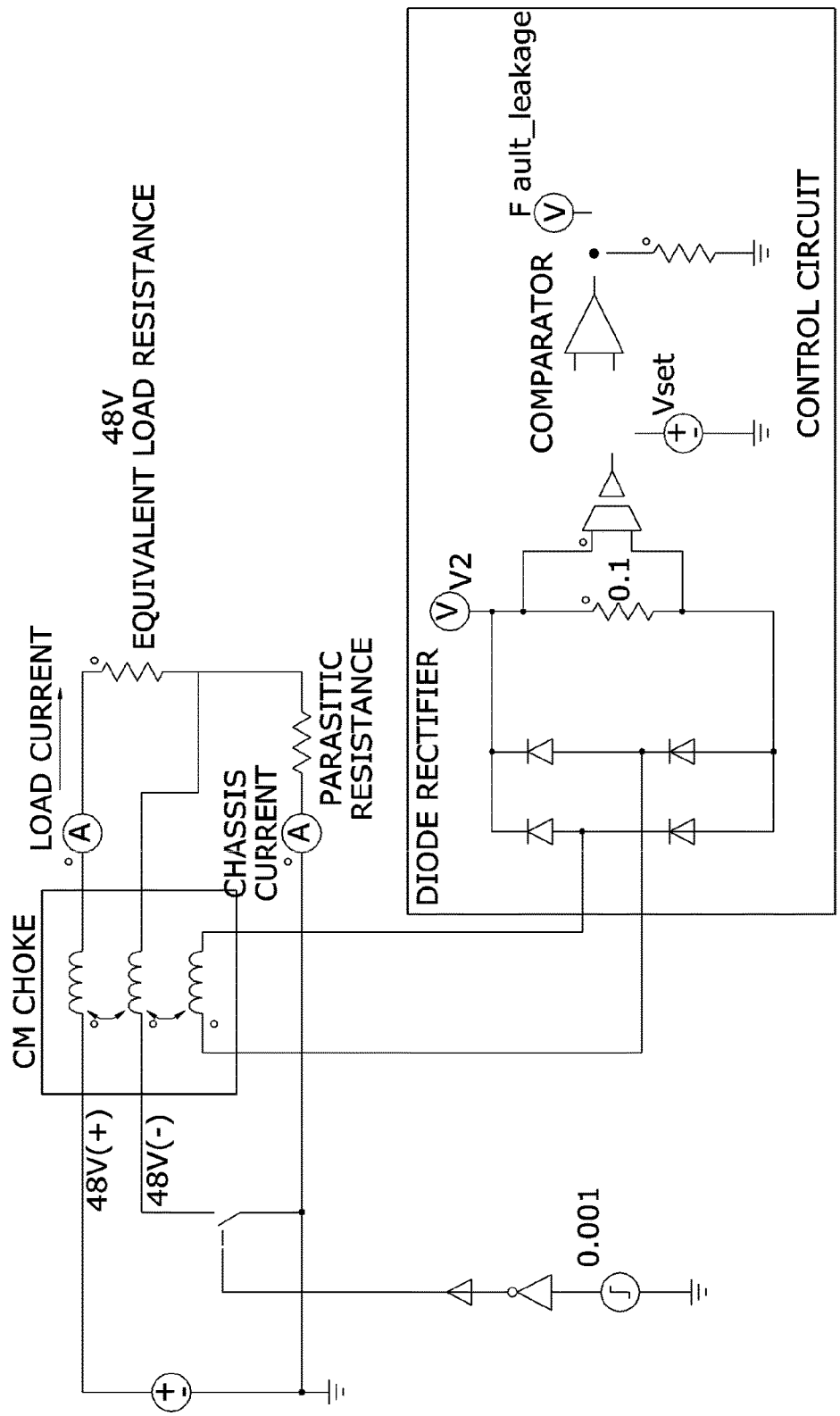
FIG. 5 is a circuit diagram illustrating a process of detecting a leakage current performed by an apparatus for detecting a leakage current of a high-power line of an inverter of a 48V mild hybrid system according to an embodiment of the present invention.

FIG. 5 is a circuit diagram illustrating a process of detecting a leakage current performed by an apparatus for detecting a leakage current of a high-power line of an inverter of a 48V mild hybrid system according to an embodiment of the present invention.

FIG. 5 is a circuit diagram illustrating a state in which an additional winding is provided. An input filter included in an inverter includes a CM choke, and the additional winding B (see FIG. 4) or an additional winding C (see FIG. 5) is connected to the CM choke. A leakage voltage generated by a current difference (a leakage current) between high-power DC positive (+) and negative (−) lines is detected at C of FIG. 5, the detected voltage is converted into a DC voltage through a diode rectifier to detect a positive/negative voltage, and the converted DC voltage is compared to a test voltage $V_{set}$, which is set for detecting a leakage current, so that a leak condition is detected. A method of detecting the leak condition will be described again with reference to FIG. 7A to FIG. 7C.

The CM choke is used as an input filter for electromagnetic compatibility (EMC) regulation in a high-power input unit of the inverter. When a leakage current is generated due to a temporary unbalance between load currents of 48V positive (+) and negative (−) lines, the additional winding is provided to detect a voltage generated by an induced electromotive force by an inductor.

According to the present invention, a leakage current may be detected without a large additional cost by mounting an additional winding on a CM choke included in a conventional inverter.

The additional winding mounted on the CM choke is connected to a control board of the inverter and connected to an input unit of a control circuit for detecting a leakage current. The detected leakage voltage is used by a diode rectifier to detect a positive/negative input load current, and the voltage rectified as DC (+) is compared to the test voltage $V_{set}$, which is set for detecting a leakage voltage, so that the leak condition is determined.

Figure 6:
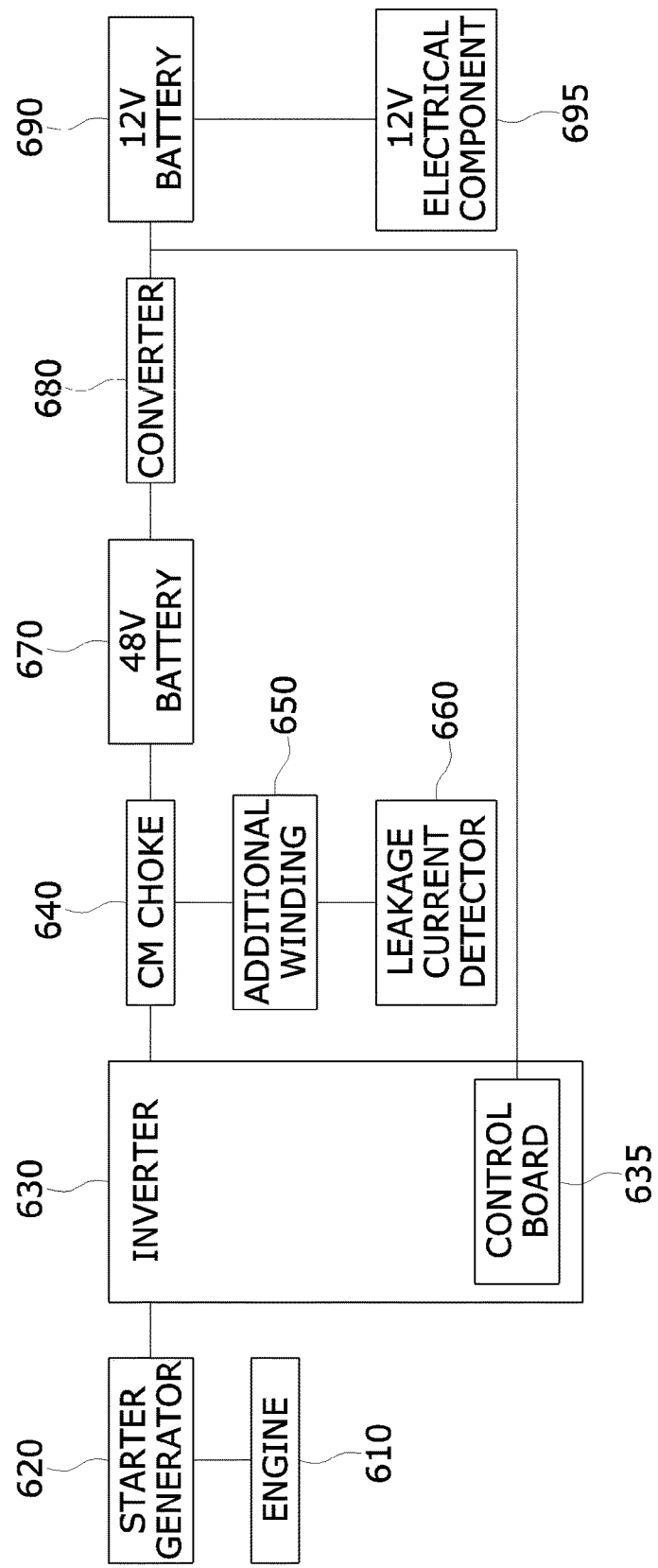
FIG. 6 is a diagram schematically illustrating an apparatus for detecting a leakage current of a high-power line of an inverter of a 48V mild hybrid system according to an embodiment of the present invention; and FIG. 7A to FIG. 7C is a graph illustrating experimental results for describing a method of detecting a leakage current according to a simulation using an apparatus for detecting a leakage current of a high-power line of an inverter of a 48V mild hybrid system according to an embodiment of the present invention.

FIG. 6 is a diagram schematically illustrating an apparatus for detecting a leakage current of a high-power line of an inverter of a 48V mild hybrid system according to an embodiment of the present invention.

The apparatus for detecting a leakage current of a high-power line of an inverter of a 48V mild hybrid system according to the embodiment of the present invention includes a starter generator manufactured as a synchronous motor, in which a conventional field winding is wound around a rotor, and configured to generate starting torque and generating torque for the engine, a 48V battery configured to supply 48V DC power and be charged by the starter generator, a 12V battery configured to supply power to internal electrical components of a vehicle, an ISG control inverter provided between the starter generator and the 48V battery and provided as a power semiconductor switch which controls a stator and the rotor of the starter generator, wherein a winding output from the inverter is connected to the rotor through a brush and a slip ring, a DC-DC converter configured to convert the power of the 48V battery into 12V battery power and supply the 12V power, a CM choke provided between the ISG control inverter and the 48V battery, and a leakage current detector connected to the CM choke and configured to detect a leakage current.

Figure 7A:
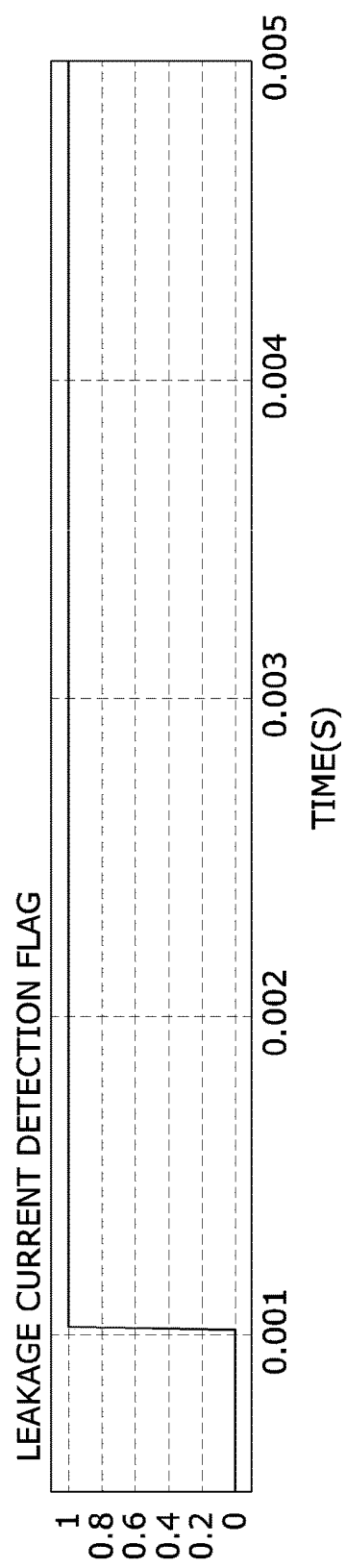
Figure 7B:
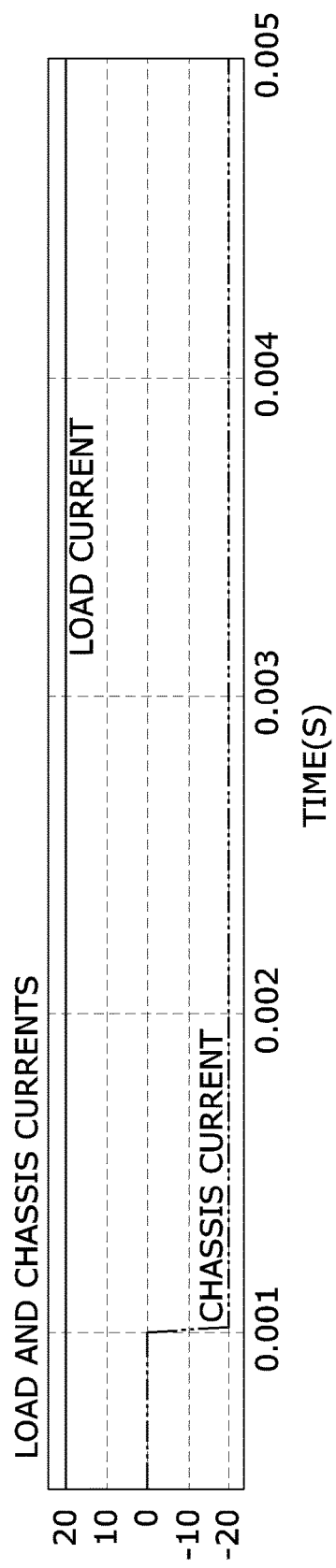
Figure 7C:
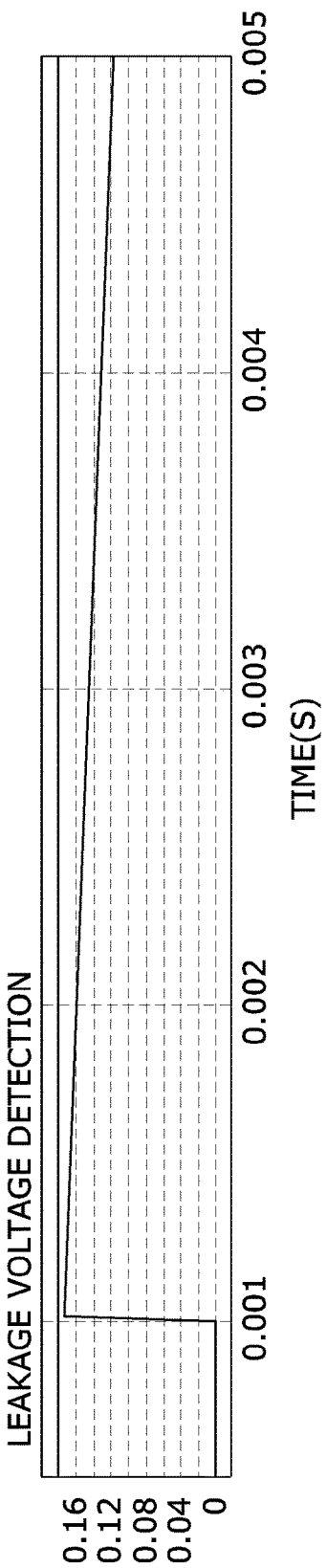

FIG. 7A to FIG. 7C is a graph illustrating experimental results for describing a method of detecting a leakage current according to a simulation using an apparatus for detecting a leakage current of a high-power line of an inverter of a 48V mild hybrid system according to an embodiment of the present invention.

FIG. 7A to FIG. 7C illustrates simulation waveforms of the method proposed in the present invention. FIG. 7A illustrating a leakage current detection flag may illustrate a situation in which a negative (−) cable of a 48V high-power line is disconnected at 0.001 second. This is a result that is finally obtained in the present invention. However, in the present invention, instead of separately providing a current detector in the inverter, an induced electromotive force generated in the additional winding provided in the CM choke is rectified by a rectifier and is then compared to the test voltage $V_{set}$. A leakage voltage V is illustrated in FIG. 7C.

Equation 1 which is a formula for the leakage voltage V according to the induced electromotive force is as follows.

$$V = L\frac{di}{dt} \quad \text{[Equation 1]}$$

For example, when it is assumed that a test voltage is 0.18V, a chassis current $i_{ground}$ is determined by the following Equation 2.

$$i_{ground} = \frac{1}{L}\int (V - V_{set})dt \quad \text{[Equation 2]}$$

Since $V_{set}$ is a preset value, it is known. Since $V-V_{set}$ is known from a comparator of FIG. 5, the result illustrated in FIG. 7C may be obtained. When an integrated circuit is connected to the circuit of FIG. 5, a value of a chassis current at a bottom of a graph of FIG. 7B may be obtained, and thus a leakage current condition may be easily detected. The method of detecting a leakage current according to the embodiment of the present invention may detect a leakage current of a high-power line and a cable disconnection.

According to the present invention, a leakage current can be detected using a CM choke, which is a conventional power part. As a specific example, a method of detecting a leakage current using a 48V MHSG control inverter is provided.

According to the present invention, in a power converter, such as an inverter and a converter of a 48V mild hybrid system, an apparatus for detecting a leakage current and cable disconnection of a high-power line may be implemented at low cost, and thus reliability of the system can be improved, and since a connector including an interlock function is not used, a production cost of the system can be reduced. With the expansion of the 48V mild hybrid market, costs of materials related to parts of power converters (e.g., an inverter and a converter) may be reduced, and reliability of the system can be secured.

As described above, while configurations of the present invention have been described with reference to the accompanying drawings, these configurations are only examples. It should be apparent to those skilled in the art that various modifications and alterations may be made within the scope of the present invention. Therefore, it should be understood that the scope of the present invention is defined not by the detailed description of the invention but by the appended claims.

What is claimed is:

1. An apparatus for detecting a leakage current of a high-power line of an inverter of a 48V mild hybrid system, the apparatus comprising:
   a starter generator manufactured as a synchronous motor, in which a conventional field winding is wound around a rotor, and configured to generate starting torque and generating torque for an engine;
   a 48V battery configured to supply 48V direct current (DC) power and be charged by the starter generator;
   a 12V battery configured to supply power to internal electrical components of a vehicle;
   an integrated starter generator (ISG) control inverter provided between the starter generator and the 48V battery and provided as a power semiconductor switch which controls a stator and the rotor of the starter generator, wherein a winding output from the inverter is connected to the rotor through a brush and a slip ring;
   a DC-DC converter configured to convert the power of the 48V battery into 12V battery power and supply the 12V power;
   a common mode (CM) choke provided between the ISG control inverter and the 48V battery;
   a leakage current detector connected to the CM choke and configured to detect a leakage current; and
   a memory and a processor,
   wherein:
   the leakage current detector outputs a detected leakage voltage; and
   the processor measures the leakage current by integrating the output leakage voltage.

2. The apparatus of claim 1, wherein:
   the CM choke includes an additional winding; and
   when a wire connected to the inverter is disconnected, the additional winding is induced by an induced electromotive force and a leakage voltage is generated.

3. The apparatus of claim 1, wherein the leakage current detector includes:
   a diode rectifier configured to rectify a leakage voltage generated in the CM choke;
   a comparator configured to compare the rectified voltage to a preset test voltage; and
   a determiner configured to determine whether a leakage current is generated according to a result of the comparison.

4. A method of detecting a leakage current of a high-power line of an inverter of a 48V mild hybrid system, the method comprising:
   generating, by a starter generator, starting torque and generating torque for an engine;
   supplying, by an ISG control inverter, 48V DC power from the generated generating torque to a 48V battery;
   supplying, by a DC-DC converter, the 48V DC power to a 12V battery;
   allowing a wire of the inverter to be disconnected and a leakage voltage to be generated in a CM choke due to an induced electromotive force;
   measuring the leakage voltage; and
   detecting a leakage current from the leakage voltage,
   wherein the detecting of the leakage current includes measuring the leakage current by integrating the detected leakage voltage.

5. The method of claim 4, wherein, in the generating of the leakage voltage, when a wire connected to the inverter is disconnected, a CM choke including an additional winding is induced by an induced electromotive force, the leakage voltage is generated, and the leakage voltage is transmitted to a leakage current detector through the additional winding.

6. The method of claim 4, wherein the detecting of the leakage current includes:
   rectifying, by a diode rectifier, the leakage voltage generated in the CM choke;

comparing, by a comparator, the rectified voltage to a preset test voltage; and determining whether a leakage current is generated according to a result of the comparison.

* * * * *